(12) United States Patent
Hoglund et al.

(10) Patent No.: US 11,330,736 B1
(45) Date of Patent: May 10, 2022

(54) VIDEO RECORDER WITH COOLING AND DRIP PROTECTION

(71) Applicant: MOTOROLA SOLUTIONS, INC., Chicago, IL (US)

(72) Inventors: James Hoglund, Dallas, TX (US); David H. McClintock, Boynton Beach, FL (US); Chi T. Tran, Naperville, IL (US); James Dulaney, Princeton, TX (US); Jorge L Garcia, Plantation, FL (US)

(73) Assignee: MOTOROLA SOLUTIONS, INC., Chicago, IL (US)

( * ) Notice: Subject to any disclaimer, the term of this patent is extended or adjusted under 35 U.S.C. 154(b) by 0 days.

(21) Appl. No.: 17/076,419

(22) Filed: Oct. 21, 2020

(51) Int. Cl.
*H05K 5/02* (2006.01)
*H05K 7/20* (2006.01)
*G06F 1/20* (2006.01)

(52) U.S. Cl.
CPC .......... *H05K 7/20172* (2013.01); *G06F 1/20* (2013.01); *H05K 5/0217* (2013.01); *H05K 5/0239* (2013.01); *H05K 7/20145* (2013.01)

(58) Field of Classification Search
CPC ...... G06F 1/20; H05K 5/0217; H04N 5/2251; B60R 11/04; B60R 2011/0003; B60R 2011/0068; B60R 2011/0077; B60R 2011/007; B60R 2300/10
See application file for complete search history.

(56) References Cited

U.S. PATENT DOCUMENTS

| | | | |
|---|---|---|---|
| 8,374,653 B2 * | 2/2013 | Yokoyama | H05K 7/20127 455/575.1 |
| 2002/0041484 A1 | 4/2002 | Lajara et al. | |
| 2005/0280786 A1 * | 12/2005 | Moiroux | G06F 1/18 353/119 |
| 2006/0049728 A1 * | 3/2006 | Yu | G06F 1/181 312/223.2 |
| 2019/0073005 A1 * | 3/2019 | Han | G06F 1/181 |
| 2020/0329572 A1 * | 10/2020 | Wittenberg | H05K 5/0017 |

* cited by examiner

*Primary Examiner* — Stephen S Sul
*Assistant Examiner* — Alexander Ryan Horton
(74) *Attorney, Agent, or Firm* — Barbara R. Doutre

(57) ABSTRACT

A video recorder (100) is configured and assembled to provide improved ventilation for cooling and improved protection against liquid intrusion. The video recorder is formed of a main chassis housing, a top cover, and a bezel for coupling the top cover to the main chassis housing. Once assembled, channels are formed which provide paths for both liquid egress and airflow intake. The channels allow airflow into fan intake openings located within a top portion of the main chassis housing. The channels further provide for liquid to be diverted away from the fan intake openings.

18 Claims, 6 Drawing Sheets

VIDEO RECORDER WITH COOLING AND DRIP PROTECTION

FIELD OF THE INVENTION

The present invention relates generally to communication devices and more particularly to video recorders mounted within challenging environments, such as vehicular environments.

BACKGROUND

The integration of camera and video recording systems within a vehicular environment continues to expand. Public safety vehicles, such as those used by law enforcement and first responders, as well as commercial vehicles and even some private vehicles may all have applications for such systems. While the cameras of such systems may be mounted throughout the vehicle, the video recorder device is typically mounted for ease of access to user interface features. Robustness and protection of the video recorder against heat build-up and liquid intrusion is important to the protection of video data stored therein. Protection of the stored data should also be balanced with maintaining accessibility to that data via a user interface. Reduction in piece part count and ease of serviceability are also parameters to take into consideration when designing a video recorder for the vehicular environment.

Accordingly, there is a need for an improved video recorder.

BRIEF DESCRIPTION OF THE FIGURES

The accompanying figures where like reference numerals refer to identical or functionally similar elements throughout the separate views and which together with the detailed description below are incorporated in and form part of the specification, serve to further illustrate various embodiments and to explain various principles and advantages all in accordance with the present invention.

Figure 1A:
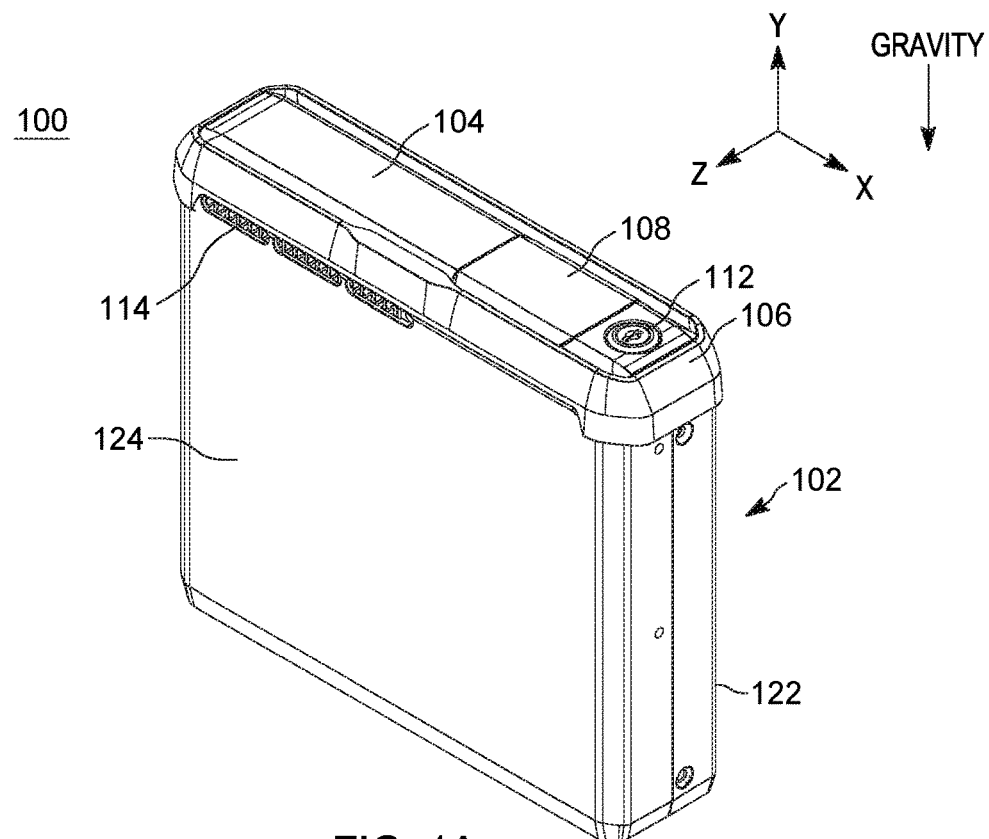
FIG. 1A is a perspective view of a video recorder formed in accordance with the various embodiments.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

Before describing in detail embodiments that are in accordance with the present invention, it should be observed that the embodiments reside primarily in an improved housing configuration for a video recorder. Accordingly, the components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

In this document, relational terms such as first and second, top and bottom, and the like may be used solely to distinguish one entity or action from another entity or action without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element preceded by "comprises . . . a" does not, without more constraints, preclude the existence of additional identical elements in the process, method, article, or apparatus that comprises the element.

Briefly, there is provided herein a video recorder configured and assembled to provide improved ventilation for cooling and improved protection against liquid intrusion. The video recorder is formed of a main chassis housing, a top cover, and a bezel for coupling the top cover to the main chassis housing. Once assembled, channels are formed which provide paths for both liquid egress and airflow intake. The channels allow airflow into fan intake openings located within a top portion of the main chassis housing. The channels further provide for liquid to be diverted away from the fan intake openings. The channels further minimize RF emissions from the video recorder.

Figure 1B:
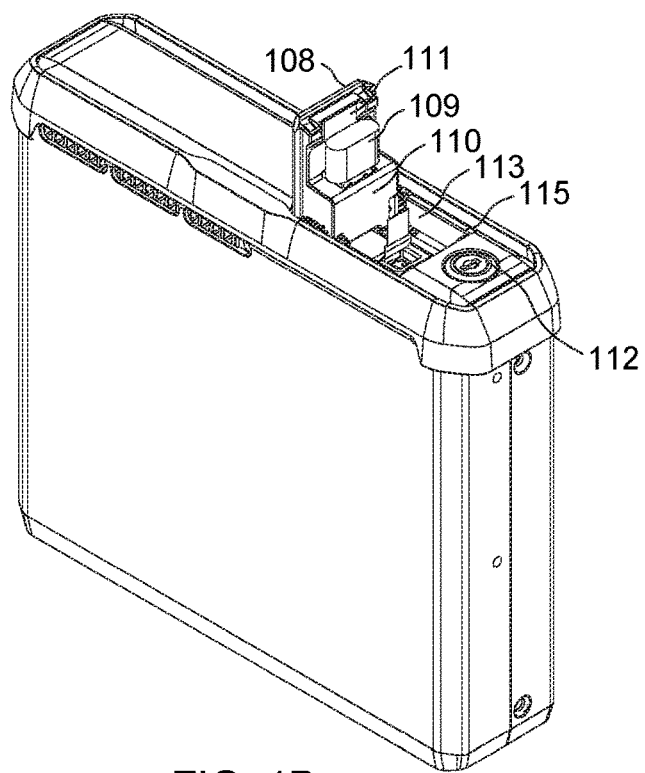
FIG. 1B is the perspective view of FIG. 1A showing access to a user interface feature of the video recorder formed in accordance with the various embodiments.

FIGS. 1A and 1B show perspective views of a video recorder 100 formed in accordance with the various embodiments. The video recorder comprises a main chassis housing 102, a top cover 104, and an open bezel 106 coupling the top cover to the chassis. The top cover 104 provides a user interface comprising a pivoting door 108 for accessing an electronic feature, preferably a USB port 110. The top cover 104 further comprises a lock 112 for locking/unlocking the pivot door to gain access to the USB port 110. The video recorder 100 may be used in a variety of communication environments, such as law enforcement, security, and the like. The video recorder 100 is particularly well suited to vertical in-vehicle applications, where the recorder is vertically mounted between two seats of the vehicle for easy user access to the user interface of the top cover 104. An x-y-x axis is shown in FIG. 1A to indicate mounting of the video recorder 100, wherein the y-axis is normal to the top cover 104 of the device (gravity points in the negative y axis). The z-axis defines the device's thickness, and the x-axis defines the device's width, and y-axis defines the device's depth. Video recorder 100 comprises electronics such as controller and receiver (not shown), for recording and storing video signals captured from a plurality of remote cameras, such as mounted within or mounted externally to a vehicle.

In accordance with various embodiments, the top cover 104 further comprises a fin arrangement 114 integrated thereon, the fin arrangement being located between the open bezel 106 and the chassis 102 in the assembled device. A similar fin arrangement is located on the opposite side. The chassis housing 102 is a two-piece chassis housing having a first chassis housing portion 122 and second chassis housing portion 124. The top cover 104 of the embodiments advantageously provides improved drip protection, improved cooling, operates as an RF shield, and provides protection against foreign objects into the video recorder 100. As a shield, the top cover 104 operates to minimize RF emissions. The fin arrangement 114 of top cover 104, located between open bezel 106 and chassis 102, advantageously provides the improved drip protection, improved cooling, and protection against foreign objects into the video recorder.

FIG. 1B is another perspective view of the video recorder 100 formed in accordance with the various embodiments. In this view, the pivoting door 108 is shown in an opened position thereby providing user access to the USB port 110 integrated thereon. Pivoting door 108 is opened by unlocking lock 112. The USB port 110 is advantageously located on a inside surface 109 of pivoting door 108 thereby allowing for easy user insertion and retraction of a memory stick 111 to and from the port. When the pivoting door 108 is closed, the USB port 110 sits within a recess 113 of the assembly, thereby protecting the memory stick 111. Integrating the USB port 110 as part of the inside of the door 108 provides easy port access without finger pinching or insertion of fingers into the recess 113.

Pivoting door 108 is coupled to lock 112 via a plurality of elements, such as spring loaded latch, damping elements, and cam features. In response to rotation to the lock 112, the pivoting door 108 opens for allowing for insertion or removal of the USB memory stick 111. The pivot door 108 is closed by pushing the pivot door towards the top cover 104.

Figure 2:
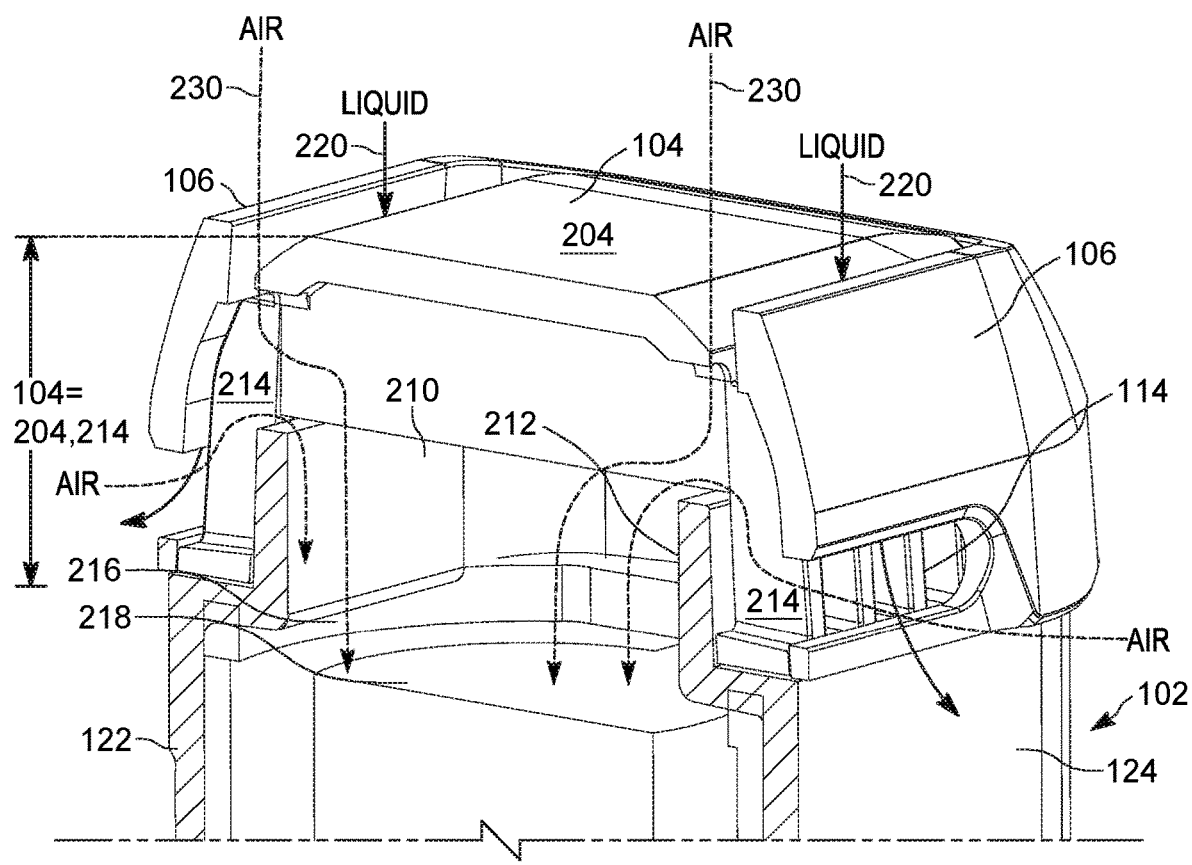
FIG. 2 is a partial cut-away view of the video recorder in accordance with the various embodiments.

FIG. 2 is a partial cut-away view of the video recorder 100 showing a portion of fin arrangement 114 in accordance with the various embodiments. This view shows how air enters the unit from the top through a top portion of the fin arrangement 114 for entry into one or more fan intakes 216, while liquid entering through the top gets diverted externally along a side portion of the fin arrangement 114. As seen in this view, the top cover 104 comprises a flat planar surface 204 extending into downward finned sidewalls 214 forming fin arrangement 114. The open bezel 106 leaves the top planar surface of cover 104 exposed while securing the finned sidewalls of top cover 104 against the exterior of the chassis housing 102.

In accordance with some embodiments, the chassis housing 102 comprises first and second surround features 210, 212 extending from each of the first chassis housing portion 122 and the second chassis housing portion 124 respectively. The surround features 210, 212 (shown more fully in other views) surround a one or more of fan intakes, shown here as fan intake 216. As will be shown later, surround features 210, 212 form complete fan surrounds for each fan intake providing for improved heat transfer effectiveness. Both the chassis housing 102 and the top cover 104 with fin arrangement 114 are formed of metal castings, while the bezel 106 is formed of a hard ruggedized plastic.

The open bezel 106, the top cover 104, and the chassis housing 102 are configured to prevent direct water entry into a convection fan 218, while still allowing airflow for vertical in-vehicle mounting. As seen in FIG. 2, liquid passes between the open bezel 106 and top cover 104 along fins 114 to exit downward and away from the exterior of chassis housing 102. The fin arrangement 114 provides channels for air flow (from the vehicle) into fan intakes 216 The top cover 104 having planar surface 204 and downward sidewalls 214 blocks RF emissions out of the chassis housing 102. The fin arrangement 114 of downward sidewalls 214 also blocks physical objects from getting into the chassis housing 102.

Figure 3:
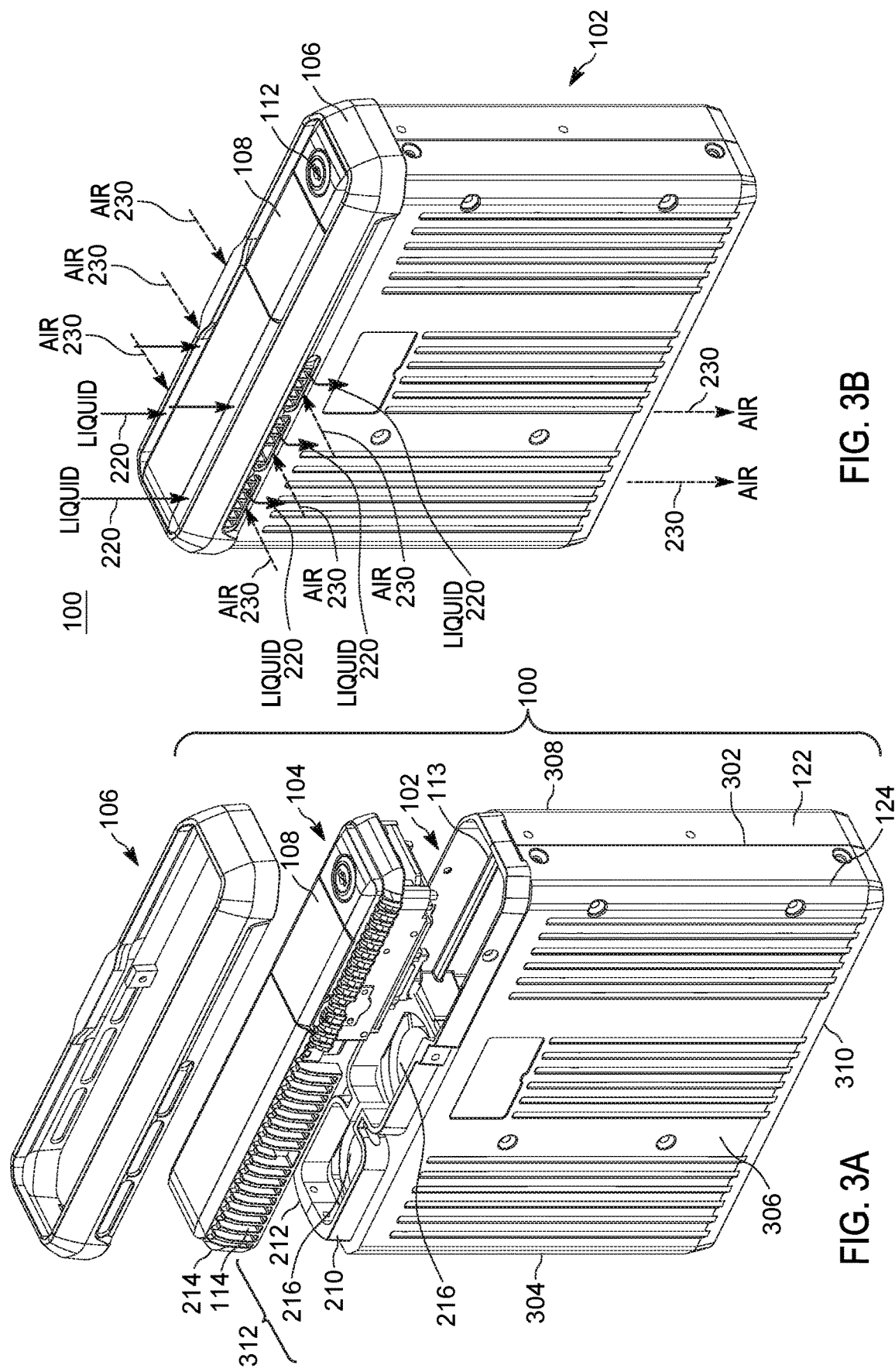
FIG. 3A is an exploded view of the video recorder in accordance with various embodiments
FIG. 3B is an assembled view of the video recorder from FIG. 3B in accordance with various embodiments.

FIG. 3A shows an exploded view of the video recorder 100 in accordance with some embodiments. FIG. 3B shows an assembled view of the video recorder 100 in accordance with some embodiments. Both views show chassis housing 102, top cover 104, and open bezel 106 in the vertical mounting orientation. As stated earlier the chassis housing 102 is a two-piece chassis housing formed of first chassis housing portion 122 and second chassis housing portions 124. The chassis housing portions 122, 124 assembled together provide the main chassis housing 102 formed of four vertical side surfaces 302, 304, 306, 308, a bottom surface 310 and a top modular surface 312. The chassis housing portions 122, 124 may be screwed, or otherwise assembled to form the main chassis housing 102.

The top modular surface 312 of chassis housing 102 provides a plurality of recessed openings within which first and second fan intakes 216 and USB port recess 113 are located. First and second surround features 210, 212, located on each chassis half 124, 122 respectively which together on the top modular surface 312 to surround each of first and second fan intakes 216. The first and second surround features 210, 212 form a figure-8 around the two fan intakes 216 for improved airflow.

The top cover 104 comprises a substantially plat planar surface 204 extending into downward finned sidewalls 214 having fin arrangement 114. The top cover 104 may be screwed, or otherwise mounted, to the top modular surface 312 of chassis housing 102.

The open bezel 106 fits over top cover 104 leaving pivot door 108 and lock 112 accessible to users. The open bezel 106 may be screwed, or otherwise mounted, via snaps alignment tabs and the like, to the top modular surface 312.

As seen in FIGS. 3A and 3B. The fin arrangement 114 of downward sidewalls 214 of top cover 104 provide for longer fins in areas associated with the fan intakes 216 and shorter fins for areas associated with the USB port. The longer fins associated with the fan intakes 216 are exposed to the exterior providing channels for liquid egress and airflow, which are highly advantageous in balancing the need for airflow in combination with protection against water intrusion into the fans. While the shorter fins associated with USB port provide for a balanced contour, the USB port itself does not require ventilation and is protected against liquid intrusion in the closed door position.

Figure 4:
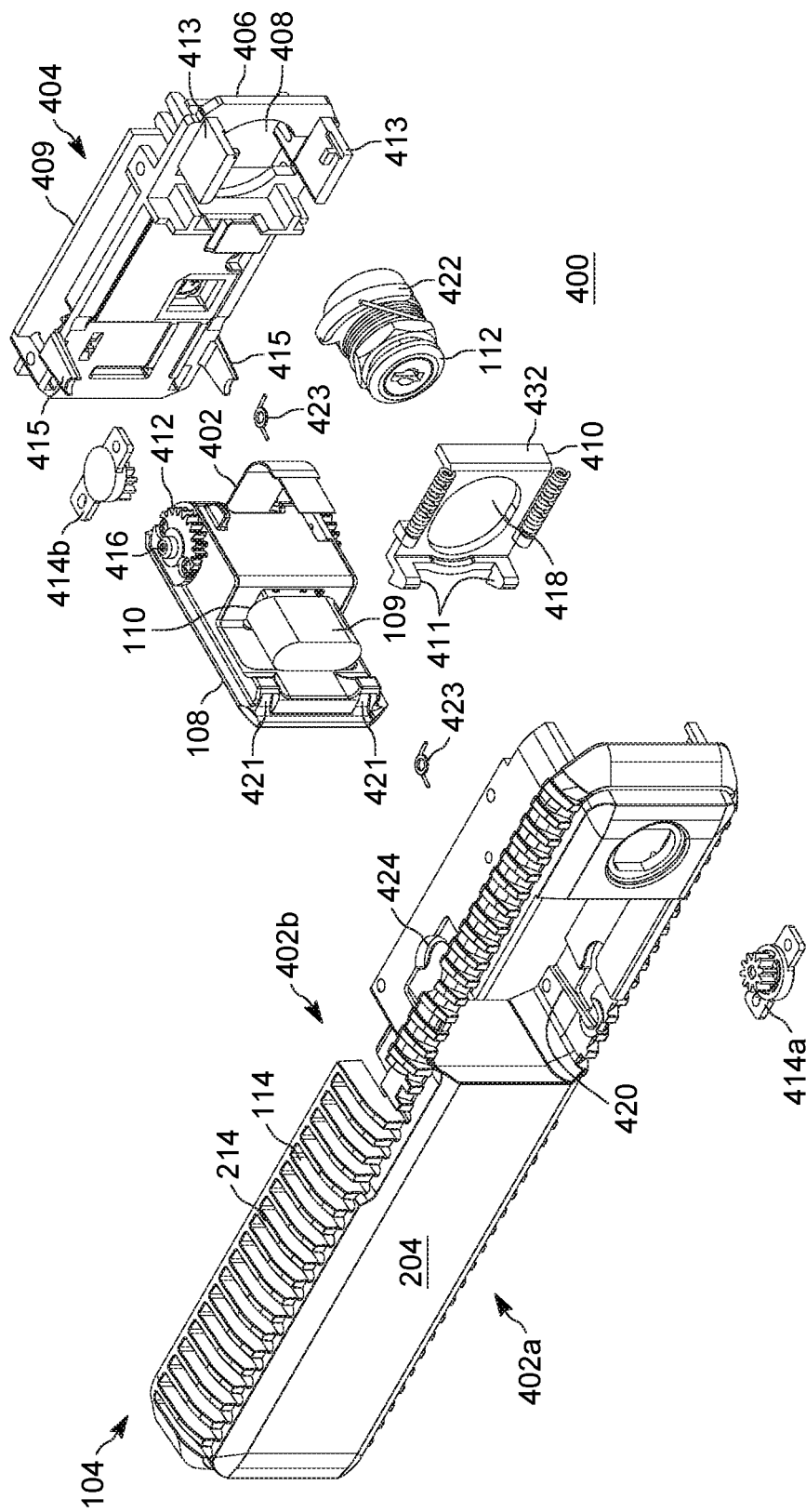
FIG. 4 is an exploded view of the top cover of the video recorder in accordance with the various embodiments.

FIG. 4 is an exploded view of a top cover assembly 400 for top cover 104 of the video recorder in accordance with the various embodiments. The top cover assembly 400 comprises sub-assemblies formed generally of the top cover 104, pivot door 108, a sliding latch 410, lock 112, and a sub-assembly module 404 for coupling the pivot door 108 to the front cover 104.

The top cover 104 is formed, as previously described, of flat planar surface 204 extending into downward finned sidewalls 214 forming fin arrangement 114. The top cover also comprises an assembly recess 420 and one or more gear recesses 424. The gear recesses 424 accept one or more pivot dampeners 414a, 414b on outer sides of the top cover. Top cover 104 includes assembly slots with half-circles providing bearing surfaces for pivots 416 of the pivot door 108.

The pivot door 108 comprises a main gear element 412 axially mounted to the inside surface of the door via a pivot 416. The main gear element 412 with pivot 416 are integral, with two main gears 412 axially mounted at either end of pivots 416. Hence, two pivot/main gear pieces are used. Depending on the amount of throttling control desired for the pivot door, only one dampener may be used (e.g. 414a). For additional throttling control, a second dampener can be used (e.g. 414b). The assembly recess 420 of top cover 104 accepts the pivot 416 as pivot door 108 gets assembled to the top cover 104 from underneath. The USB port 110 is also mounted to the inside surface of the pivot door 108 as previously described and is shown with memory stick 109 inserted therein. A flex 402 extends form USB port 110 for coupling to an electronic interconnect (not shown) located within the sub-assembly module 404. The pivot door 108 has first and second latch recesses 421 located at an opposite end from the main gear element 412 on the inside of the door.

Sub-assembly module 404 is a plastic back housing having printed circuit board (pcb) (409) with electronic components disposed thereon and a platform 406 with an opening 408 for accommodating the base of lock 112. The platform 406 of sub-assembly module 404 has fastening ribs 413 extending therefrom to support the sliding latch 410. The sub-assembly module 404 also includes a tab 415 with half-circle end extending from the plastic housing, the tab with half circle end providing a bearing surface for holding the pivot 416. If two pivots are used then first and second tabs 415 with half-circle ends would be used to provide the bearing surfaces for holding the respective pivots 416 of pivot door 108, Sliding latch 410 is formed of a platform having a latch opening 418 formed therethrough and a wall 432 extending therefrom for receiving the lock 112. The fastening ribs 413 extending from sub-assembly module 404 support the sliding latch 410. A cam 422 of lock 112 bears against the platform surface of the sliding latch 410. The sliding latch includes two latch arms 411. The latch arms 411 are engaged into corresponding latch recesses 421 of pivot door 108 during a closed door position. When the pivot door 108 is open, the latch arms 411 disengage from the door's corresponding latch recesses 421.

Pivot door 108 is spring loaded to sub-assembly module 404 via a two-arm spring 423. One arm of spring 423 gets inserted into slot 433 of sub-assembly module 404, and the second arm gets inserted into a slot (not shown) in door 108. The spring 423 being coupled between the pivot door 108 and the sub-assembly module 404 allows spring loading of the pivot door in a default open position relative to the top cover. The door's default position being in the open position allows assembly to take place with the door open. The pivot door is closed by pushing the pivot door towards the top cover.

Form an assembly standpoint, the top cover 104 is assembled by first dropping pivoting door 108 (in the open position) into the backside of top cover 104 until pivot 416 bears up against assembly recess 420.

Next, sliding latch 410 is dropped into latch recesses 421 of pivot door 108. The lock 112 is dropped into the corresponding latch opening 418 of the sliding latch 410, thereby bearing the cam 422 of the lock 112 against the wall 432 of sliding latch 410 as well as upon platform 406 of sub-assembly module 404. Again, sliding latch 410 is a spring loaded sliding latch supported by fastening ribs 413. The sliding latch 410 disengages from the pivot door 108 allowing the door to open when the lock 112 is unlocked as latch arms 411 disengage from latch recesses 421.

Pivot door 108, sliding latch 410 and lock 112 are then held in place by attaching sub-assembly module 404. Fastening ribs 413 support the sliding latch 410. The lock 112 is inserted into the opening 408 of platform 406 of sub-assembly module 404. The first and second tabs 415 of sub-assembly module 404 provide bearing surfaces for holding the pivot(s) 416. The top cover 104 includes assembly recesses 420 which provide the bearing surfaces for pivots 416. Thus, the pivots 416 of the door 108 are retained by the back cover 404 and the front cover 104. Next, one or more pivot dampeners 414a, 414b are dropped into corresponding gear recesses 424 of cover 104 allowing the gears of dampening gear element(s) 414a, 414b to engage with gears of larger gear elements 412.

Having the larger gear element (s) 412 as part of the pivot door 108 and second smaller gear element(s) provided by one or more pivot dampeners 414a, 414b improves throttled speed control of the door swing. The throttled speed is further controlled by a predetermined gear ratio provided by the axially located main gears 412 on the pivot door having a larger diameter than that of the one or more pivot dampeners 414a, 414b. The result is the dampening gear rotates faster than the speed of the door opening which results in higher control over speed of opening.

Figure 5A:
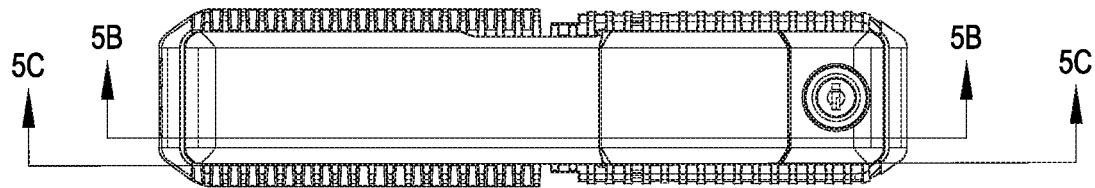
FIG. 5A is a top view of the top cover of the video recorder in accordance with the various embodiments.

FIG. 5A is a top view of the top cover 104 of the video recorder 100 in accordance with the various embodiments. This view shows the pivot door 108 in closed position, lock 112, and fin arrangement 114. Cross-sectional markings 5B and 5C are shown to align with subsequent cross sectional views of the cover.

Figure 5B:
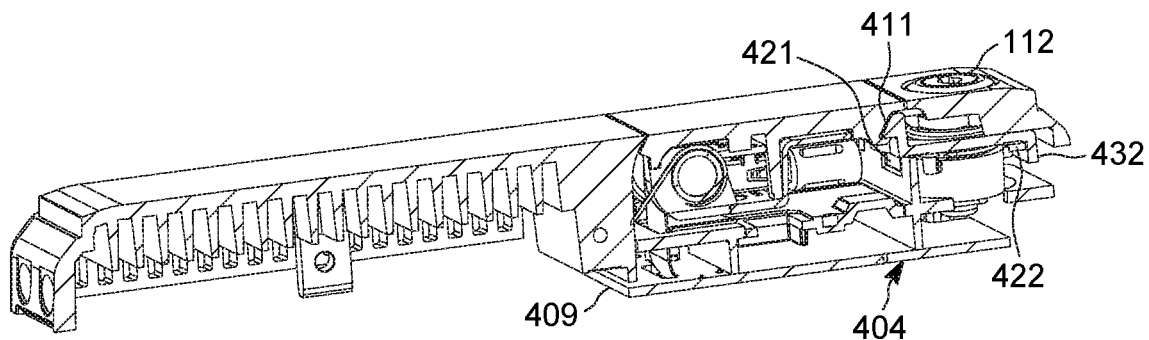
FIG. 5B is a cross sectional perspective view of the top cover in accordance with the various embodiments.

FIG. 5B is a cross-sectional view cut across the cover 104 to reveal the assembly of the sliding latch 410 in the closed door position in accordance with various embodiments. This view shows one of the two latch recesses 421 located in pivot door 108, and one of the two latch arms 411 located on pivot door 108. The latch arms 411 are engaged into corresponding latch recesses 421 of pivot door 108 during the closed door position. When the pivot door 108 is open, the latch arms 411 disengage from the door's corresponding latch recesses 421. The cam surface 422 of lock 112 is shown bearing against the sliding latch wall 432 in the closed door position.

Figure 5C:
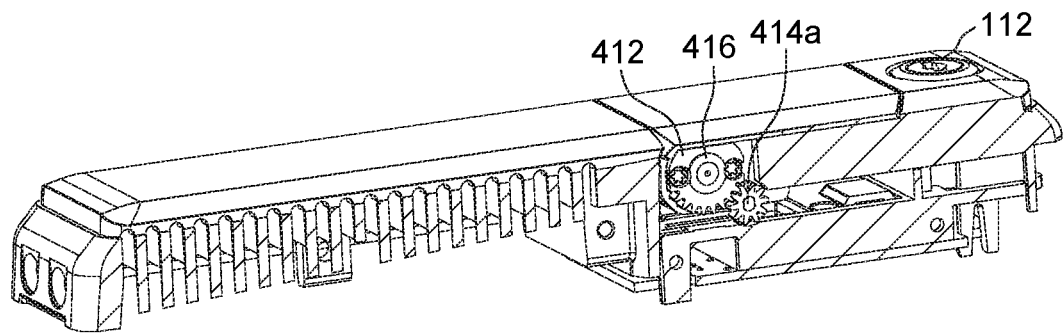
FIG. 5C is another cross sectional perspective view of the top cover in accordance with the various embodiments.

FIG. 5C is a cross-sectional view cut across the cover 104 to reveal the gear elements in accordance with various embodiments. The larger, main gear element 412 with pivot 416, as stated previously, are part of the pivot door 108, while the smaller gear element 414a is a dampening gear element held in place on cover 104. As stated back in FIG. 4, two main gear element 412 and two pivots 416 are integral and always used. The dampening gear element 414a (and, if desired 414b) are independently placed, and only one damping element may be suitable depending on the amount of dampening desired. For some applications, if more damping control is desired then the second dampening element 414b can be used. When the lock 112 is turned and the pivot door 108 rotates via pivot 416, the larger, main gear element(s) 412 rotate which in turn causes the smaller gear element 414a (and if used also 414b) to be rotated and dampen the rotation.

Figure 6A:
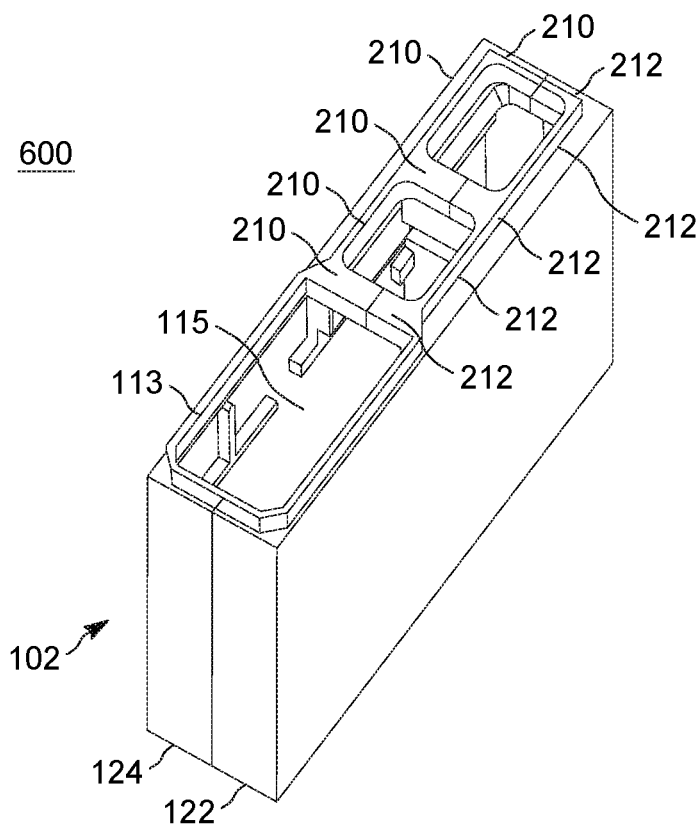
FIG. 6A is a simplified outline view of the chassis housing of the video camera in accordance with the various embodiments.
Figure 6B:
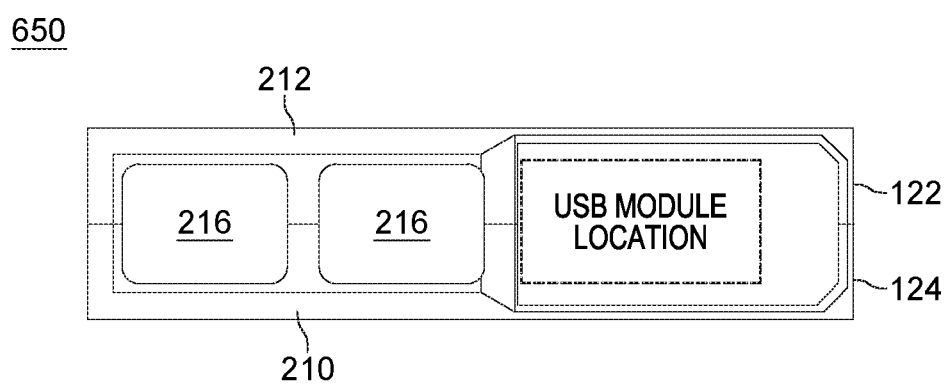
FIG. 6B is a simplified outline view of the top modular surface of the chassis housing of FIG. 6A.

FIG. 6A is a simplified outline view 600 of the chassis housing 102 from the previous figures in accordance with the various embodiments. FIG. 6B is a simplified outline view 650 the top modular surface 312 of the chassis housing 102 of FIG. 6A in accordance with the various embodiments. These views show the first and second fan intakes 216 and further show the recess 113 with opening 115 for receiving the sub-assembly module attached to the front cover (providing pivot door access to the USB port—shown in other views). These views are provided to further illustrate the two piece chassis 122, 124 being brought in contact together to form the chassis housing 102, wherein in accordance with some embodiments, first and second surround features 210, 212, located on each chassis half, come together to surround each of first and second fan intakes 216.

The fan surround features 210, 212 have been designed to completely surround each of the fan intakes 216 when the two chassis portions are coupled together. When two or more fan intakes are present the surround features preferably form a figure-eight shaped surround between adjacent fan intake openings. Simulations have shown that the surround features 210, 212 forming complete fan surrounds for each fan intake 216 improves the effectiveness of heat transfer by over twenty percent.

Accordingly, and referring to the previous figures, there has been provided a chassis housing 102) formed of a casting having a top, a bottom, and four side surfaces, the top of the chassis housing having one or more fan intake openings 216 with surround features extending 210, 212 therefrom; a top cover 104 formed of a casting having finned sidewalls 114 extending downward therefrom, the top cover having a sub-assembly module 404) attached thereto providing access to an electronic feature; and a bezel 106 coupling the top cover 104 to the top of the chassis housing, the bezel having an opening providing access to the top cover, the bezel having sidewalls extending downward from the opening, the sidewalls of the bezel and the finned sidewalls 114 of the top cover 104 forming channels between the bezel and the chassis housing, the channels providing both liquid egress and air intake, wherein: the surround features divert liquid to the channels allowing liquid to flow downwards between the bezel and the chassis housing and exit down an exterior surface of the chassis housing; and the channels allow air to flow into the surround features from the top cover and the sidewalls through to the one or more fan intake opening.

Accordingly there has been provided an improved video recorder. The anti-drip approach provided by the embodiments does not restrict airflow. The anti-drip overhang channels seamlessly integrate with the ventilation system without additional piece parts. Improved airflow at reduced fan speed provides for a quiet device. The improved user interface provided by the controlled throttle of the pivot door provides easy access to the user. The video recorder also offers protection from RF emissions.

In the foregoing specification, specific embodiments of the present invention have been described. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

We claim:

1. A video recorder, comprising:
   a chassis housing formed of a casting having a top, a bottom, and four side surfaces, the top of the chassis housing having one or more fan intake openings with surround features extending therefrom;
   a top cover formed of a casting having finned sidewalls extending downward therefrom, the top cover having a sub-assembly module attached thereto providing access to an electronic feature; and
   a bezel coupling the top cover to the top of the chassis housing, the bezel having an opening providing access to the top cover, the bezel having sidewalls extending downward from the opening, the sidewalls of the bezel and the finned sidewalls of the top cover forming channels between the bezel and the chassis housing, the channels providing both liquid egress and air intake, wherein:
   the surround features divert liquid to the channels allowing the liquid to flow downwards between the bezel and the chassis housing and exit down an exterior surface of the chassis housing; and
   the channels allow air to flow into the surround features from the top cover and the sidewalls through to the one or more fan intake openings.

2. The video recorder of claim 1, further comprising:
   a user interface on the top cover.

3. The video recorder of claim 2, wherein the video recorder is a vehicular video recorder for vertically mounting between two seats of a vehicle thereby providing user access to the user interface via the top cover.

4. The video recorder of claim 2, wherein the user interface comprises:
   a pivot door on the top cover, the pivot door having the electronic feature integrated thereon; and
   a lock on the top cover, the lock controlling the opening of the pivot door for access to the electronic feature.

5. The video recorder of claim 1, further comprising:
   a pivot door having the electronic feature integrated thereon, the electronic feature being a USB port; and
   a lock for opening the pivot door and providing user access to the USB port.

6. The video recorder of claim 5, wherein the pivot door is closed by pushing the pivot door towards the top cover.

7. The video recorder of claim 1, wherein the top cover with the finned sidewalls also provides RF shielding to the video recorder.

8. The video recorder of claim 1, further comprising:
   a recess located in the top of the chassis housing (102), the recess being located adjacent to the one or more fan intake openings (216), the recess for receiving the sub-assembly module of the top cover, the sub-assembly module of the top cover providing a pivot door (108), the pivot door providing access to the electronic feature.

9. The video recorder of claim 8, wherein the electronic feature comprises a USB port integrated onto the pivot door.

10. The video recorder of claim 8, wherein the top cover assembly further comprises:
    a main gear element axially located on a backside of the pivot door, the main gear element having a pivot; and
    a damping gear element loaded though at least one sidewall of the finned sidewalls, the damping gear element engaging with the main gear element to provide throttled speed control of the pivot door.

11. The video recorder of claim 10, wherein the main gear is larger in diameter than the damping gear element to provide a predetermined gear ratio that controls the throttled speed of the pivot door.

12. The video recorder of claim 10, wherein the top cover assembly further comprises:
 a spring coupled between the pivot door and the sub-assembly module, the spring loading the pivot door in a default open position relative to the top cover; and
 a spring loaded sliding latch for coupling and decoupling a lock to and from the pivot door.

13. The video recorder of claim 12, wherein the spring loaded sliding latch engages to the pivot door when the pivot door is in a closed position relative to the top cover, and the spring loaded sliding latch disengages from the pivot door when the pivot door is in an open position relative to the top cover.

14. The video recorder of claim 13, wherein the top cover assembly further comprises:
 latch recesses on a backside of the pivot door, the latch recesses engaging the spring loaded sliding latch in a door closed position; and
 in response to rotation to the lock, a cam feature of the lock slides the spring loaded sliding latch to disengage from the latch recesses thereby opening the pivot door and enabling user access to the electronic feature.

15. The video recorder of claim 14, wherein the sub-assembly module comprises:
 a plastic housing;
 a printed circuit board (pcb) with electronic components disposed thereon, the pcb being mounted to the plastic housing;
 an opening in the plastic housing for retaining the lock;
 a tab with a half-circle end extending from the plastic housing, the tab with the half circle end providing a bearing surface for holding the pivot; and
 fastening ribs extending from the plastic housing, the fastening ribs supporting the spring loaded sliding latch.

16. The video recorder of claim 1, wherein the at least one or more fan intake openings comprises a plurality of fan intake openings located on the top of the chassis housing and adjacent to each other; and
 the surround features completely surround each of the plurality of fan intake openings.

17. The video recorder of claim 16, wherein the surround features form a figure-eight surround between adjacent fan intake openings of the plurality of fan intake openings.

18. A video recorder, comprising:
 a chassis housing for mounting within a vehicle, the chassis housing having one or more fan intake openings with surround features extending therefrom;
 a top cover retained to the chassis housing with a bezel, the top cover comprising a pivot door for user-access to an electronic feature, and
 the top cover having finned sidewalls and the bezel having sidewalls, the finned sidewalls of the top cover and the sidewalls of the bezel being configured to form channels between the bezel and the chassis housing for both liquid egress away from the chassis housing and air intake into the chassis housing.

* * * * *